(12) United States Patent
Herr

(10) Patent No.: US 7,786,748 B1
(45) Date of Patent: Aug. 31, 2010

(54) METHOD AND APPARATUS FOR SIGNAL INVERSION IN SUPERCONDUCTING LOGIC GATES

(75) Inventor: Quentin P. Herr, Ellicott City, MD (US)

(73) Assignee: Northrop Grumman Systems Corporation, Los Angeles, CA (US)

(*) Notice: Subject to any disclaimer, the term of this patent is extended or adjusted under 35 U.S.C. 154(b) by 0 days.

(21) Appl. No.: 12/467,195

(22) Filed: May 15, 2009

(51) Int. Cl.
H03K 19/195 (2006.01)
(52) U.S. Cl. .............................. 326/3; 326/7
(58) Field of Classification Search ................ 326/1–7
See application file for complete search history.

(56) References Cited

U.S. PATENT DOCUMENTS

| | | | |
|---|---|---|---|
| 4,117,354 A | | 9/1978 | Geewala |
| 4,496,854 A | * | 1/1985 | Chi et al. ........................ 326/5 |
| 4,623,804 A | | 11/1986 | Goto |
| 4,916,335 A | | 4/1990 | Goto et al. |
| 5,099,152 A | | 3/1992 | Suzuki |
| 5,309,038 A | | 5/1994 | Harada et al. |
| 6,154,044 A | * | 11/2000 | Herr ............................. 326/1 |
| 6,188,236 B1 | | 2/2001 | Wikborg |
| 6,242,939 B1 | * | 6/2001 | Nagasawa et al. ............. 326/3 |
| 6,507,234 B1 | | 1/2003 | Johnson et al. |
| 6,518,786 B2 | | 2/2003 | Herr |
| 6,549,059 B1 | | 4/2003 | Johnson |
| 6,724,216 B2 | | 4/2004 | Suzuki et al. |
| 6,750,794 B1 | | 6/2004 | Durand et al. |
| 6,865,639 B2 | | 3/2005 | Herr |
| 6,960,780 B2 | | 11/2005 | Blais et al. |
| 7,498,832 B2 | | 3/2009 | Baumgardner et al. |
| 2002/0063643 A1 | | 5/2002 | Smith et al. |

(Continued)

FOREIGN PATENT DOCUMENTS

EP 0467104 1/1992

(Continued)

OTHER PUBLICATIONS

Berns et al., "Coherent Quasiclassical Dynamics of a Persistent Current Qubit", *Physical Review Letters APS USA*, vol. 97, No. 15, pp. 150502, Oct. 13, 2006.

(Continued)

*Primary Examiner*—James Cho
(74) *Attorney, Agent, or Firm*—Tarolli, Sundheim, Covell & Tummino LLP

(57) ABSTRACT

In one embodiment, the disclosure relates to a single-flux quantum logic gate capable of providing output from one of the two inputs, which is also known as the A and NOT B gate. The logic gate includes a first input gate and a second input gate for respectively receiving a first input pulse and a second input pulse. An output gate is wired in parallel with the first input gate. A first Josephson junction and a second Josephson junction are connected to the first input gate and the second input gate, respectively. A cross-coupled transformer is also provided. The cross-coupled transformer diverts the first pulse from the output gate if the second pulse is detected at the second input gate. In an optional embodiment, the first Josephson junction has a first critical current which is selected to be less than the critical current of the second Josephson junction.

48 Claims, 12 Drawing Sheets

U.S. PATENT DOCUMENTS

| | | |
|---|---|---|
| 2002/0190381 A1 | 12/2002 | Herr et al. |
| 2003/0011398 A1 | 1/2003 | Herr |
| 2003/0016069 A1 | 1/2003 | Furuta et al. |
| 2003/0039138 A1 | 2/2003 | Herr |
| 2003/0040440 A1 | 2/2003 | Wire et al. |
| 2003/0115401 A1 | 6/2003 | Herr |
| 2003/0183935 A1 | 10/2003 | Herr et al. |
| 2004/0120444 A1 | 6/2004 | Herr |
| 2004/0201099 A1 | 10/2004 | Herr |
| 2004/0201400 A1 | 10/2004 | Herr |
| 2005/0001209 A1 | 1/2005 | Hilton et al. |
| 2005/0023518 A1 | 2/2005 | Herr |
| 2005/0110106 A1 | 5/2005 | Goto et al. |
| 2005/0224784 A1 | 10/2005 | Amin et al. |

FOREIGN PATENT DOCUMENTS

| | | |
|---|---|---|
| JP | 59 167124 A | 9/1984 |
| JP | 60 191519 A | 9/1985 |
| WO | WO 2005/093649 | 10/2005 |
| WO | PCT/US2008/072017 | 8/2008 |
| WO | PCT/US2008/050864 | 11/2008 |

OTHER PUBLICATIONS

Garanin et al., Effects of nonlinear sweep in the Landau-Zener-Stueckelberg effect, *Physical Review B*, vol. 66, No. 17, pp. 174438-1-174438-11, Nov. 1, 2002.

Koch et al., A NRZ—Output Amplifier for RSFQ Circuits, *IEEE Transaction on Applied Superconductivity*, vol. 9, No. 2, pp. 3549-3552, Jun. 1999.

Ortlepp et al., "Experimental Analysis of a New Generation of Compact Josephson-Inductance-Based RSFQ Circuits", *11$^{th}$ International Superconductive Electronics Conference*, 3 pages, Jun. 10, 2007.

Wulf et al., Dressed States of Josephson Phase Qubit Coupled to an LC Circuit, *IEEE Transaction on Applied Superconductivity IEEE USA*, vol. 15, No. 2, pp. 856-859, Jun. 2, 2005.

International Search Report for corresponding PCT/US2009/061866; completed Jan. 19, 2010 by Volker Simon of the EPO.

\* cited by examiner

METHOD AND APPARATUS FOR SIGNAL INVERSION IN SUPERCONDUCTING LOGIC GATES

BACKGROUND

1. Field of the Invention

The disclosure relates to a method and apparatus for signal inversion in superconducting logic gates. More specifically, the disclosure relates to a method and apparatus for configuring signal inversion in quantum logic gates which process single flux quantum (SFQ) pulses.

2. Description of Related Art

In the field of digital logic, extensive use is made of well known and highly developed CMOS (complementary metal-oxide semiconductor) technology. As CMOS has begun to approach maturity as a technology, there is an interest in alternatives that may lead to higher performance efficiency in terms of speed, power-computational density, interconnect bandwidth and the like.

An alternative approach to CMOS technology comprises superconductor-based single flux quantum circuitry, utilizing superconducting Josephson junctions, with typical signal power of around 4 nW, at a typical data processing rate of 20 Gb/s or greater. Such devices have operating temperatures of about 4° K.

Superconductor devices based on the Josephson effect are replacing conventional devices based on semiconductor technology for higher performance and lower power. The superconductor devices are well known as a high-speed, low-power digital logic family and are scalable to very-large scale integrated (VLSI) circuits. Digital circuits that employ superconductor devices and are fabricated using present circuit fabrication technology operate at clock rates ranging between 10-100 GHz. Development of advanced superconducting devices require sophisticated Josephson junction logic gates that operate based on the superconducting principles. Therefore, there is a need for such advanced logic gates.

SUMMARY

In one embodiment, the disclosure relates to a single-flux-quantum logic gate capable of providing output from one of the two inputs, which is also known as the A and NOT B gate. The logic gate includes a first and a second input gates for respectively receiving a first and a second input pulses. An output gate is wired in parallel with the first input gate. A first Josephson junction and a second Josephson junction are connected to the first input gate and the second input gate, respectively. A cross-coupled transformer is also provided. The cross-coupled transformer diverts the first pulse from the output gate if the second pulse is detected at the second input gate.

In an exemplary method according to one embodiment of the disclosure, a method for providing a quantum logic gate includes the steps of providing a quantum logic circuit to have a first and a second input gate as well as an output gate; receiving a first input pulse at the first gate; directing the quantum logic gate to propagate the first input pulse to the output gate if a second input is not received at the second input gate; and directing the quantum logic gate to inhibit propagation of the first input pulse to the output gate if a second input pulse is received at the second input gate.

In another embodiment, the disclosure relates to a single-flux-quantum logic gate circuit. The logic gate comprises a first input gate connected in parallel to the first Josephson junction and a second input gate connected in parallel to the second Josephson junction. An output gate is configured to be in communication with the first and the second input gates. A circuit defining an offset coupling is also provided to inhibit certain flux propagations while encouraging certain other propagations. Finally, a cross-coupled transformer connecting the first Josephson junction and the second Josephson junction is provided.

In still another embodiment, the disclosure relates to a merge gate for use in single-flux-quantum circuits. The single-flux-quantum merge gate circuit includes a first input gate and a second input gate for respectively receiving the first input pulse and a second input pulse. The first and the second input gates are coupled respectively to a first Josephson junction and a second Josephson junction. A pair of cross-coupled transformers connect the first Josephson junction to the second Josephson junction such that a first input received at the first input gate is prevented from propagating to the second input gate and is instead directed to an output gate.

In still another embodiment, the single-flux-quantum logic gate circuit includes a first input gate and a second input gate for respectively receiving a first input pulse and a second input pulse, the first input gate coupled to a first Josephson junction and the second input gate coupled to a second Josephson junction; a pair of cross-coupled transformers connecting the first Josephson junction to the second Josephson junction; a first output gate and a second output gate in communication with the pair of cross-coupled transformers; and an offset coupling for biasing the transformer to direct one of the first input pulse or the second input pulse to the first output gate when only one input is received during one clock cycle.

In another embodiment, the disclosure relates to a method for controlling an output of a logic gate by (i) receiving a first reciprocal SFQ pulse at a first input gate and triggering a first Josephson junction in communication with the first Josephson junction; (ii) receiving a second reciprocal SFQ pulse at a second input gate and triggering a second Josephson junction in communication with the second Josephson junction; (iii) providing a first bias current to direct one of the first reciprocal SFQ pulse or the second reciprocal SFQ pulse to a first output if only one of the first reciprocal SFQ pulse or the second reciprocal SFQ pulse is received during one clock cycle; and (iv) directing the second reciprocal SFQ pulse to a second output if the first and the second input signals are received during one clock cycle.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

Figure 1B:
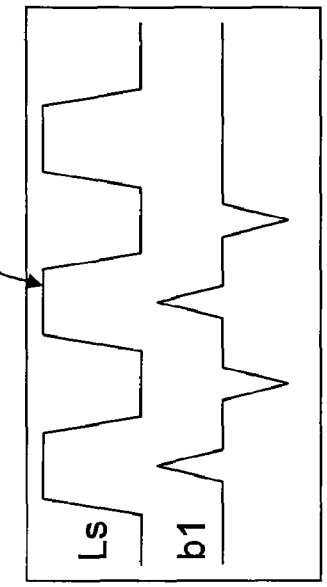
FIG. 1B shows the signal response of the JTL of FIG. 1A.
Figure 1A:
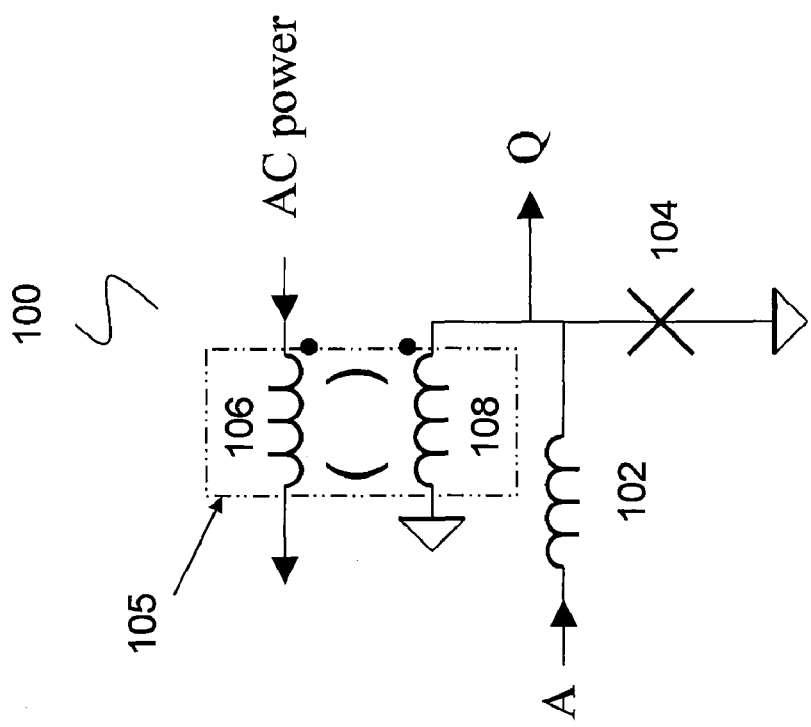
FIG. 1A shows a conventional reciprocal quantum logic Josephson Transmission Line ("JTL")

FIG. 1A shows a conventional reciprocal quantum logic circuit. More specifically, the logic circuit 100 of FIG. 1A is a Josephson Transmission Line ("JTL") having Josephson junction 104. Input pulse A is provided to Josephson junction 104 through inductor 102. Inductor 102 may be optionally added to filter out the harmonics associated with the input signal. AC power source is provided to a transformer 105 which comprises primary loop 106 and secondary loop 108. Output of JTL 105 is provided at gate Q.

FIG. 1B shows the signal response of the JTL of FIG. 1A. Referring simultaneously to FIGS. 1A and 1B, when AC power is provided to transformer 105, the circuit is powered as shown by the trapezoidal flux $L_s$ across inductor 108. If pulse input signal A is provided while inductor 108 is at a positive flux 109, the voltage pulse appears across Josephson junction 104 as noted by $b_1$ in FIG. 1B. Pulse train $b_1$ contains both positive and negative pulses. The negative pulse reflects resetting of the Josephson junction while inductor 108 is at negative flux.

Figure 1C:
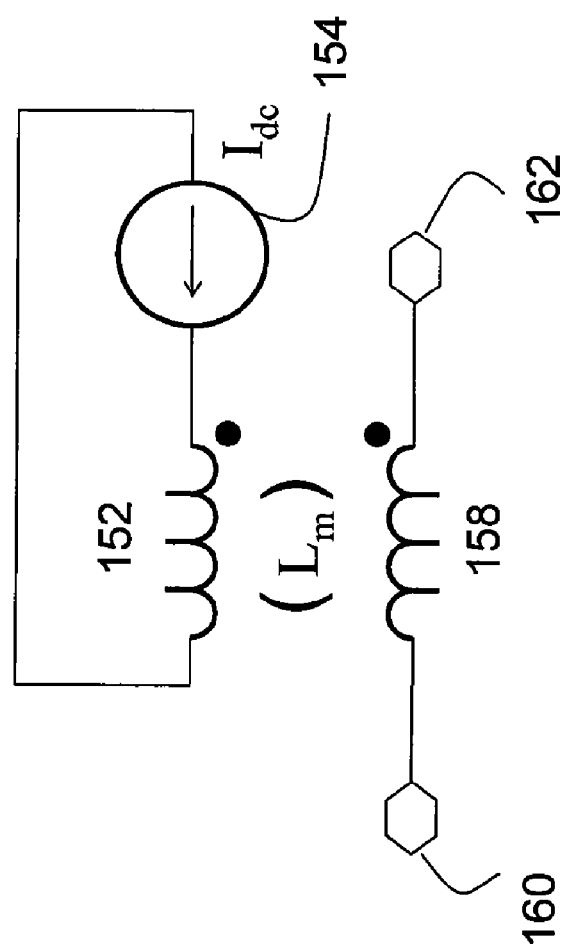
FIG. 1C shows a conventional offset coupling.

FIG. 1C shows a conventional offset coupling. Referring to FIG. 1C, nodes 160 and 162 are floating terminals which can be connected to a JTL or other circuits. Inductors 152 and 158 form mutual inductance (Lm) when DC current 154 is supplied. The offset coupling of FIG. 1C can be used to establish bias current in an inductive loop. A flux bias of one-half of a single-flux-quantum, provided by the circuit of FIG. 1C can be calculated according to the following relationship:

$$L_m I_{dc} = \frac{1}{2}\Phi_0 \quad (1)$$

Figure 2A:
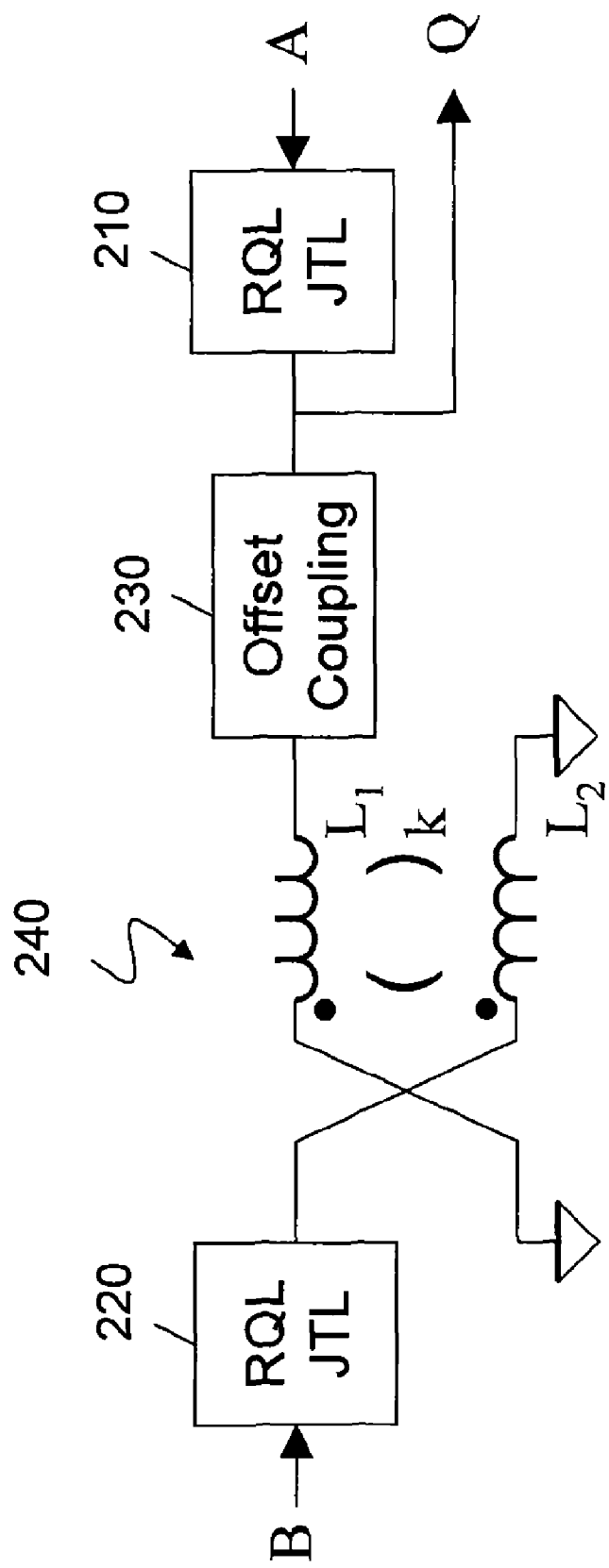
FIG. 2A schematically shows a logic gate according to one embodiment of the disclosure.

FIG. 2A schematically shows a logic gate according to one embodiment of the disclosure. More specifically, the circuit schematically represented in FIG. 2A provides a so-called A-and-NOT-B logic gate. The A-and-NOT-B gate operates by receiving inputs at a first gate and a second gate. If an input is received at the first gate while no input is received within the same clock cycle at the second gate, the received input is directed to the output. On the other hand, if a second input is received at the second input gate within the same clock cycle as receiving a first input at the first input gate, then the logic gate provides no output. In general, the second input must lead or be approximately coincident in time with the first pulse. The circuit of FIG. 2A comprises a first input gate for receiving the first input A, and a second input gate for receiving the second input B. Each of inputs A and B can define an SFQ pulse of magnitude $\Phi_0$. Moreover, inputs A and B may be received during the same clock cycle. In FIG. 2A, each input gate may be incorporated into an RQL JTL similar to those described in relation to FIG. 1A. Thus, input A may be received at RQL JTL 210 and input B may be received at RQL JTL 220. Offset coupling 230 can comprise a conventional offset coupling as described in FIG. 1C.

Finally, cross-coupled transformer 240 includes a first and a second inductor providing inductance $L_1$ and $L_2$, respectively, and having a coupling constant, k. Cross-coupled transformer 240 inverts signal B arriving from the second input gate. The loop inductance ($L_{loop}$) of transformer 240 can be described according to the following relationship:

$$L_{100} = L_1 + L_2 - 2k\sqrt{L_1 L_2} \quad (2)$$

In Equation 2, the term $2k\sqrt{L_1 L_2}$ denotes the mutual inductance between the inductors. The coupling constant can be assumed to be near unity (at about 0.9), and $L_1$ and $L_2$ can be assumed to be approximately equivalent. Therefore, the loop inductance $L_{loop}$ is much smaller than either inductance $L_1$ or $L_2$ taken individually. The flux bias current set up by the offset coupling can be described according to:

$$I = \frac{1}{2}(\Phi_0 / I_{loop}) \quad (3)$$

In Equation 3, the current I is approximately equal in magnitude in the inductors $L_1$ and $L_2$ but flows in opposite direction in these two inductors.

When a first input pulse A is provided to RQL JTL 220, the input pulse is directed to output Q if a second input pulse B is not received during the same clock cycle as A. Offset coupling 230 negates propagation of pulse A to input gate B. In an exemplary embodiment, offset-coupling 230 enhances the AC power that causes the junction at RQL JTL 210 to trigger.

As discussed in relation to Equation 1, the offset coupling can be in the order of $-\frac{1}{2}\Phi_0$, where $\Phi_0$ defines flux output of signal A. The flux output of offset coupling may flow in an opposite direction from that of input A and the flux output will have a negative sign associated therewith ($-\frac{1}{2}\Phi_0$). In one embodiment, $\Phi_0$ has a magnitude of about 2 mApH.

If input pulse B is provided during the same clock cycle as input pulse A, the input pulse B is directed to cross-coupled transformer 240 which inverts signal B and inhibits propagation of any output through Q.

In an alternative embodiment of the disclosure, offset coupling 230 is removed from the circuit. Instead, the Josephson junctions and bias inductors used in RQL JTL 210 and 220 are selected so as to allow propagation of A to output Q when there is no input B.

Figure 2B:
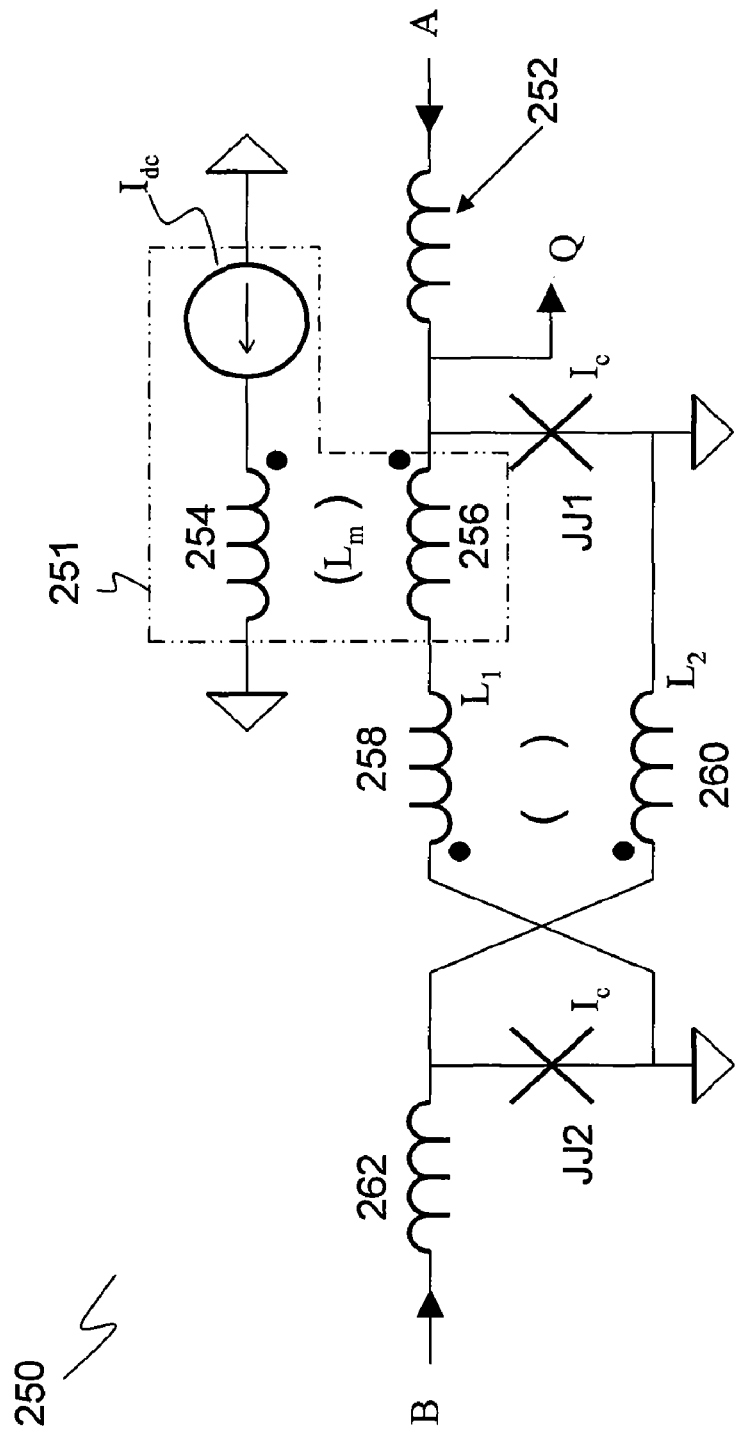
FIG. 2B is a circuit diagram for the logic gate of FIG. 2A.

FIG. 2B is a circuit diagram for the logic gate of FIG. 2A. Circuit 250 of FIG. 2A is flux-biased through a DC current source and a transformer having inductors 254 and 256. Inductors 254 and 256 power circuit 250 through mutual inductance $L_m$. A combination of DC current source ($L_{dc}$) and inductors 254 and 256 define offset coupling 230 of FIG. 2A.

Input gates A and B respectively receive input pulses A and B. Input filters 252 and 262 may be optionally added to input gates A and B, respectively. Inductors 258 and 260 are wired between the first Josephson junction ($JJ_1$) and the second Josephson junction ($JJ_2$) and define the cross-coupled transformer 240 of FIG. 2A.

When circuit 250 receives input pulse A, the pulse travels through indictor 252. If during the same clock cycle no input is received at the second input gate, then pulse A is directed to output Q, which path is enhanced by the flux output ($-\frac{1}{2}\Phi_0$) of the offset coupling 251. The output of the offset coupling 251 encourages pulse A to trigger $JJ_1$ and propagate to output Q. The triggering of $JJ_1$ reverses the flux output of the offset coupling 251 to ($+\frac{1}{2}\Phi_0$). This reverses the current flow through $JJ_2$ and inhibits triggering of $JJ_2$ and propagation of the signal to input B.

On the other hand, when circuit 250 receives input pulse A and input pulse B during the same clock cycle, the input B triggers $JJ_2$, which reverses the flux output of the offset coupling 251 to ($+\frac{1}{2}\Phi_0$). This reverses the current flow through $JJ_1$ and inhibits A from propagating to output Q. Under this circumstance, Josephson junctions $JJ_2$ is triggered and admits a pulse ($\Phi_0$) into the circuit. No output pulse is provided at Q.

The inputs to circuit 250 are reciprocal; that is, each positive input pulse is followed by a negative input pulse which effectively resets the Josephson junctions. In other words, the residual signals stored in the gate during the positive cycle are removed in the negative cycle of the input pulse.

Figure 3A:
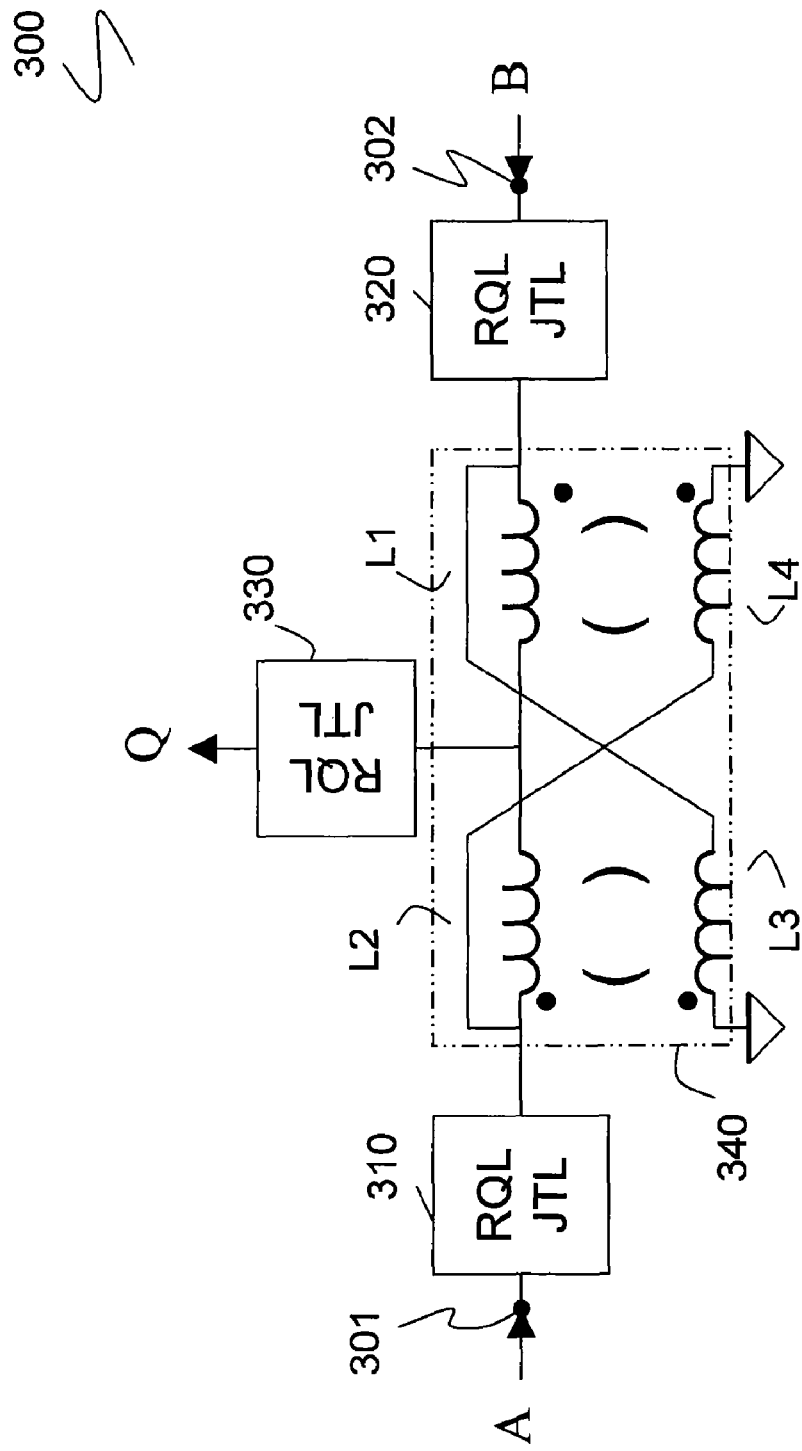
FIG. 3A is a schematic representation of a merge gate according to one embodiment of the disclosure.

FIG. 3A is a schematic representation of a merge gate according to one embodiment of the disclosure. The merge gate of FIG. 3A can be constructed using the circuit segments discussed above. In FIG. 3, the pulse inversion property of the loop transformer steers the input pulse to the output and prevents it from propagating to the opposite input gate.

Circuit 300 of FIG. 3A includes input gates 301 and 302 for respectively receiving input pulses A and B, respectively. JTL 310 communicates with input gate 301 and JTL 320 communicates with input gate 302. Either of JTL 310 or 320 can define RQL JTL, such as those discussed above. Circuit 340 includes a pair of cross-coupled transformers connecting JTL 310 and 320 such that input A received at input gate 301 is prevented from propagating to input gate 302, and instead is directed to output Q. Cross-coupled transformer 340 includes inductors $L_1, L_2, L_3$ and $L_4$. Inductors $L_1$ and $L_4$ form a mutual inductance and inductors $L_3$ and $L_2$ form a mutual inductance.

When input pulse A is received at JTL 310, input A puts current through inductor $L_2$ which triggers the output Q. It also sends current through inductor $L_4$ to ground. Once the output Q is triggered, two equal, yet opposite currents are set forth through inductor $L_1$. First, there is a left-to-right current through B input that is generated by the Josephson junction at 330. There is also a right-to-left current (cancelling out the first current) which is the coupling from inductor $L_4$ to $L_1$. The transformer effectively cancels out the left-to-right current going toward input B. Since circuit 300 is symmetric, similar currents flow when an input is received at the input gate B.

If A and B inputs are received in the same clock cycle, the coupling will act to generate two output pulses at Q. But the Q output is inhibited from going around twice because each of the Josephson junctions at each of RQL JTLs becomes starved of power once triggered. Consequently, operating margins for this mode of operation are relatively small.

Figure 3B:
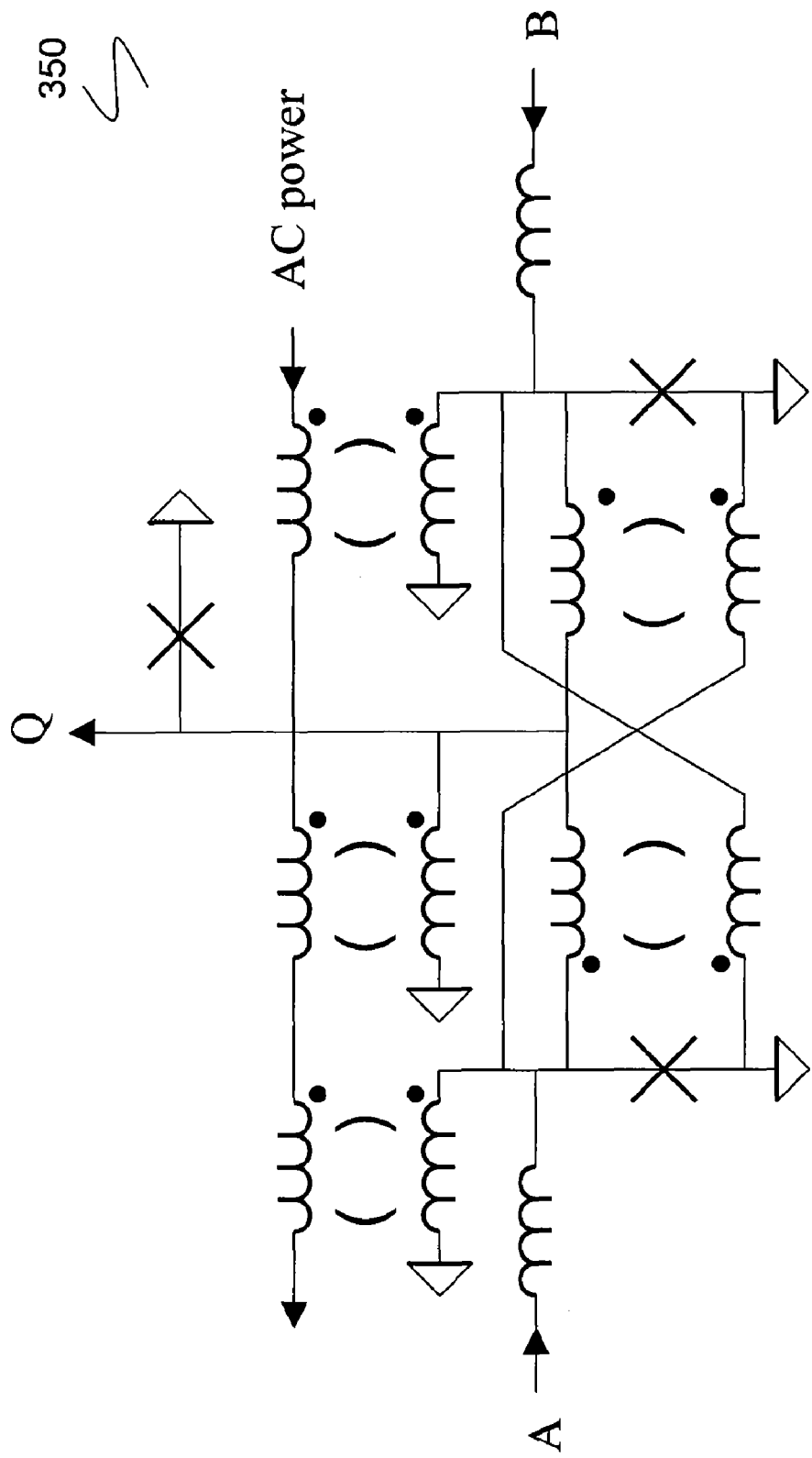
FIG. 3B is a circuit diagram for the logic gate of FIG. 3A.

FIG. 3B is a circuit diagram for the logic gate of FIG. 3A. Circuit 350 of FIG. 3B is identical to circuit 300 of FIG. 3A, assuming that the RQL JTL circuit components are as drawn in FIG. 1A.

Figure 4A:
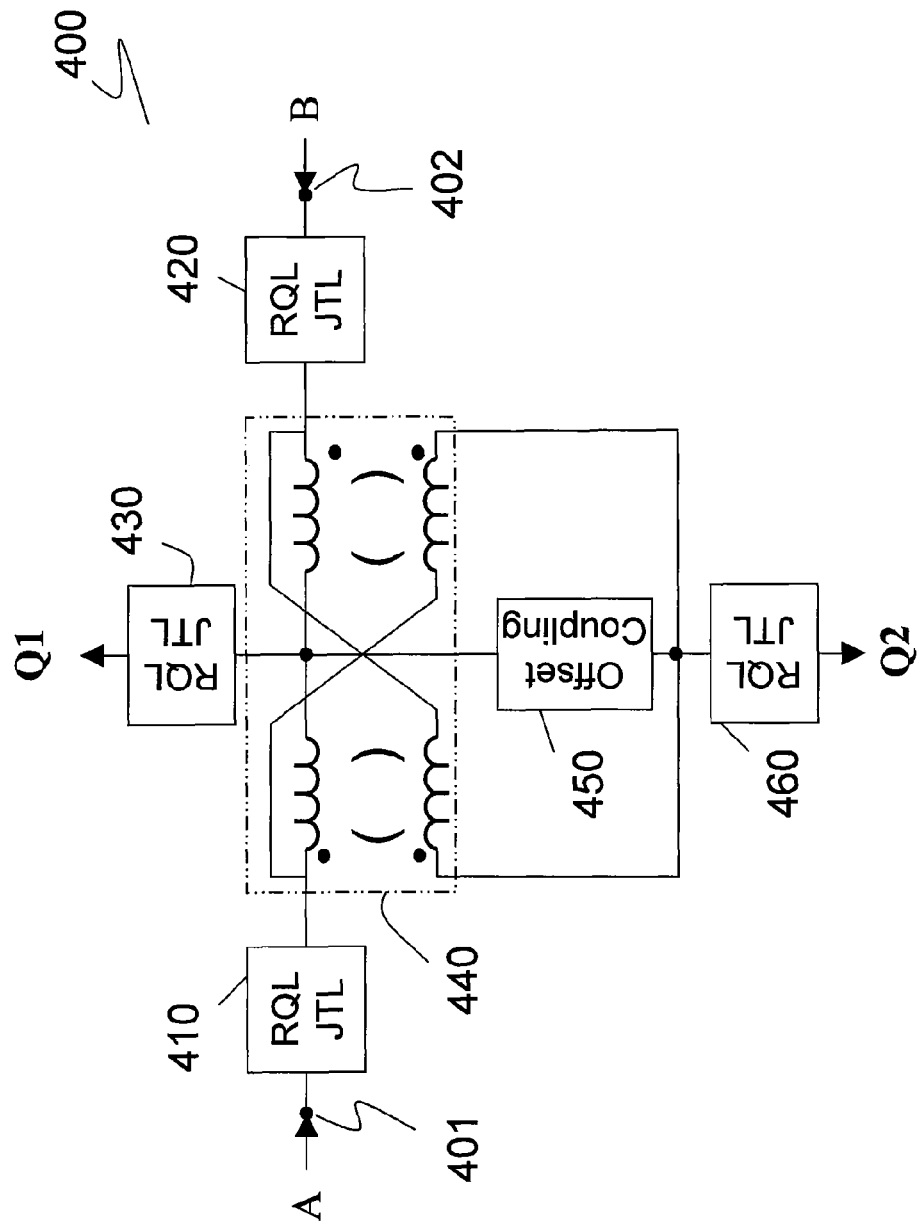
FIG. 4A is a schematic representation of an AND/OR gate according to one embodiment of the disclosure.

FIG. 4A is a schematic representation of an AND/OR gate according to one embodiment of the disclosure. Circuit 400 of FIG. 4A receives pulse signals A and B at input gates 401 and 402, respectively. Each input signal is directed to one of a respective JTLs 410 or 420. Each JTL can define, for example, an RQL JTL. A pair of cross-coupled transformers connect the first Josephson junction (not shown) associated with JTL 410 to the second Josephson junction (not shown) associated with JTL 420.

The pulse inversion property of the loop transformer 440 steers the input pulse to one of the two outputs and prevents an input pulse from propagating to the opposing input, if only one pulse is received within a clock cycle. Within a clock cycle, the first input pulse triggers the "OR" output, and the second input pulse triggers the "AND" output. That is, if input pulse A is received in the first clock cycle and input pulse B is received at a second clock cycle, the input pulses are directed to output $Q_1$ sequentially, and in the order received. In this manner, the logic gate 400 works as an OR gate with respect to output Q1.

On the other hand, if input A and input B are received during the same output pulse, then outputs are directed to output gates Q1 and $Q_2$, and the logic unit acts as an AND gate with respect to Q2. Within a clock cycle, the first input pulse triggers the "OR" output and the second input pulse triggers the "AND" output. This behavior is enhanced by offset coupling circuit 450.

It is evident from FIG. 4A that $Q_1$ and $Q_2$ are symmetric except for offset coupling 450 which pre-biases $Q_1$ (the OR output). In other words, offset coupling 450 directs current to $Q_1$. Loop transformer 440 also prevents propagation of one input into an opposite input. Thus, input pulse A does not propagate to input gate 402 and input pulse B does not propagate to gate 401. Instead, when pulse B is received within the same clock cycle as input A, offset coupling 450 changes sign and an output is produced at gate $Q_2$.

Outputs $Q_1$ and $Q_2$ trigger a first Josephson junction (not shown) associated with RQL JTL 430 to the second Josephson junction (not shown) associated with JTL 460.

Figure 4B:
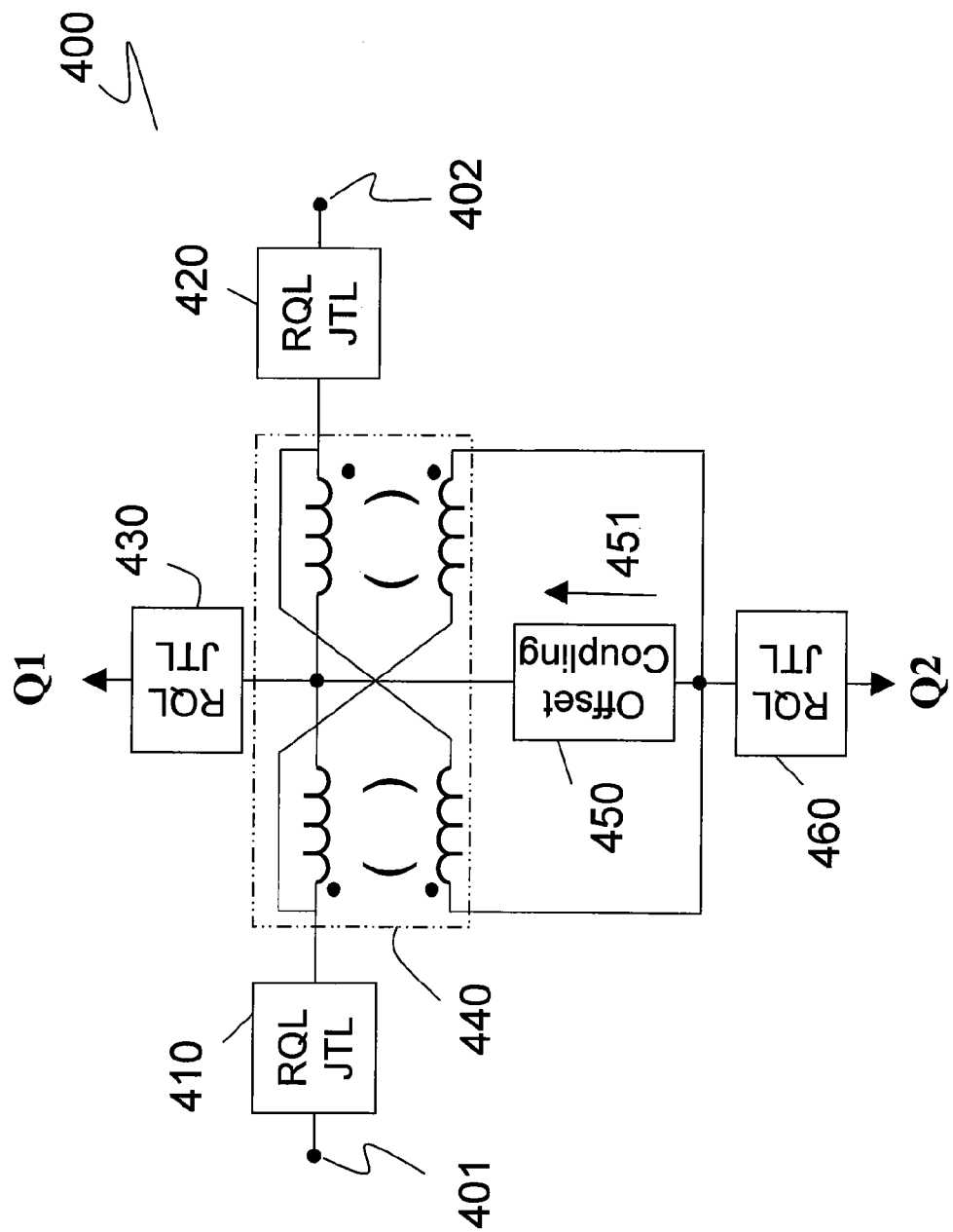
FIG. 4B shows the current flow in logic gate of FIG. 4A before any input is received.

FIG. 4B shows the current flow in logic gate of FIG. 4A before any input is received. As shown by arrow 451 next to offset coupling 450, the offset coupling steers current away from output gate $Q_2$ (the AND output) and toward output gate $Q_1$ (the OR output).

Figure 4C:
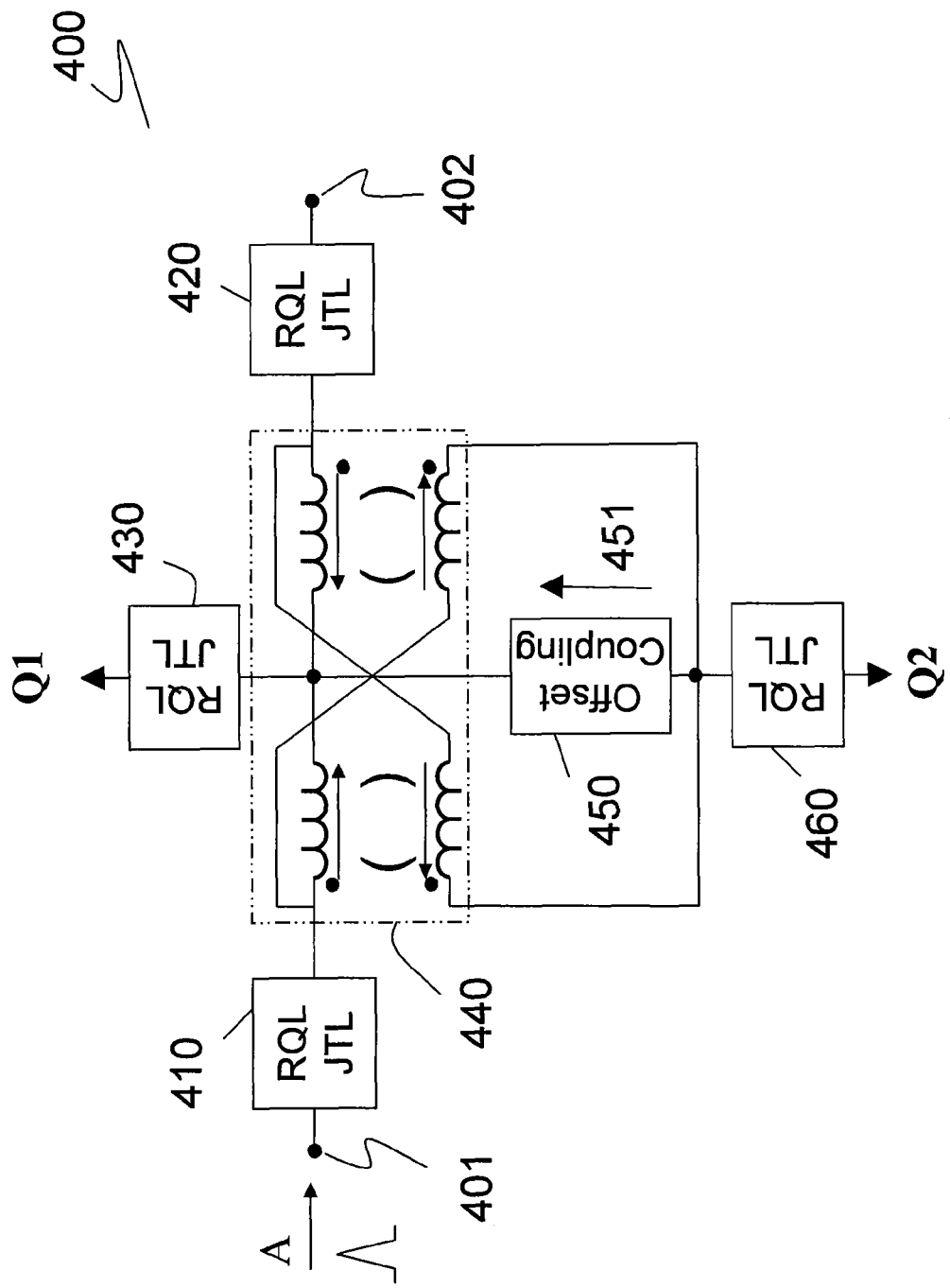
FIG. 4C shows the current flow in logic gate of FIG. 4A after first input pulse but before any output.

FIG. 4C shows the current flow in logic gate of FIG. 4A after the first input pulse but before any output. In FIG. 4C, input pulse A is shown with an arrow. The input steers current to both outputs; that is, to output $Q_1$ and $Q_2$. However, current (see arrow 451) from offset coupling 450 steers the input pulse to output $Q_1$. The current flow in each of inductors $L_1$-$L_4$ is symbolically shown with arrows. The inductance of the loop transformer 440 prevents propagation of input pulse A to input gate 402.

Figure 4D:
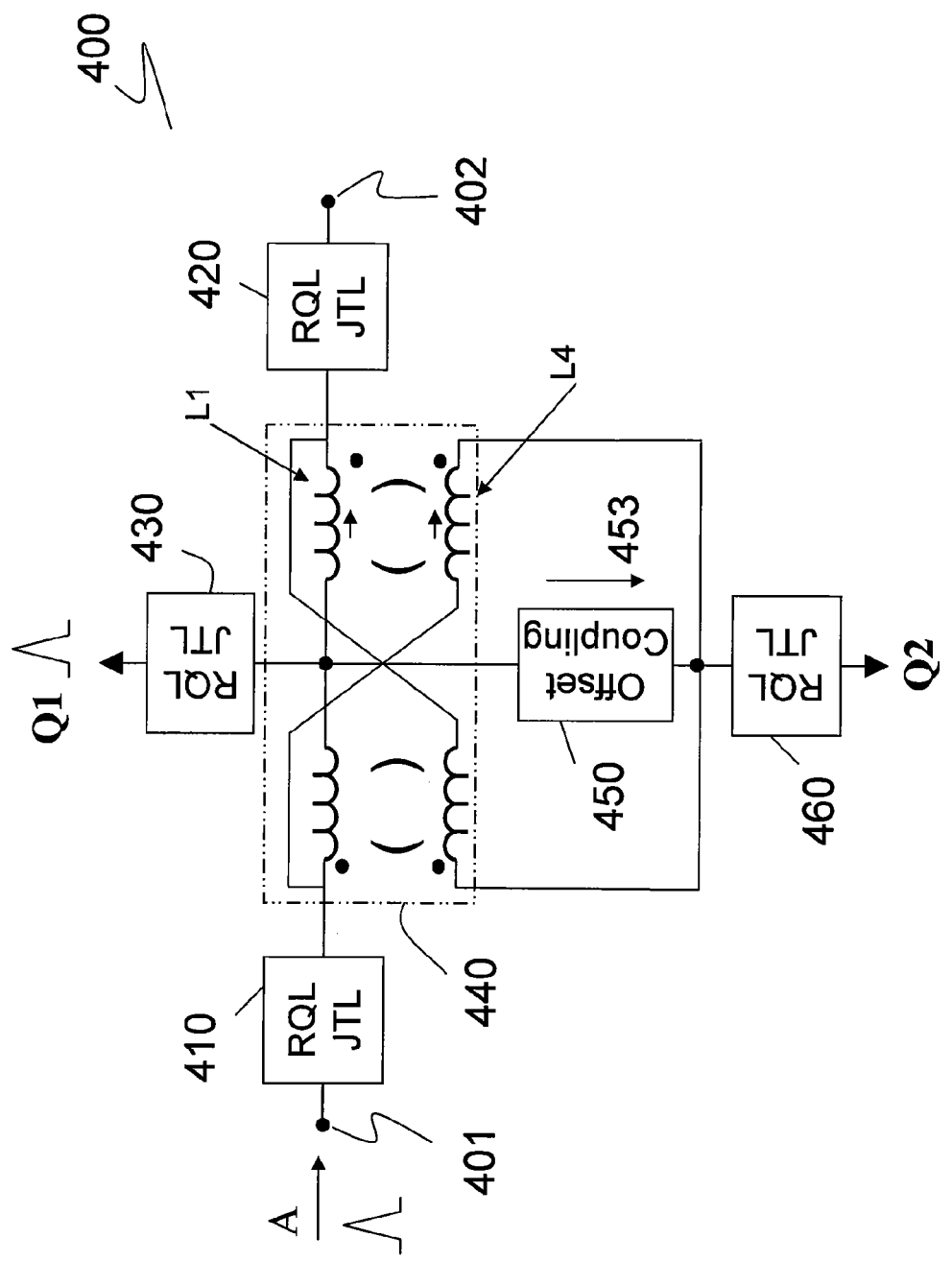
FIG. 4D shows the current flow in logic gate of FIG. 4A after the first input and after an OR output.

FIG. 4D shows the current flow in logic gate of FIG. 4A after the first input and after an OR output (i.e., output at gate $Q_1$). In FIG. 4D, the offset coupling steers input pulse A to Q1 (i.e., OR output). A small amount of current leakage can be seen at inductors L1 and L4 as shown by the respective arrows. In addition, current flow in offset coupling is now reversed as shown by arrow 453. The leakage current toward input gate 402 and output gate $Q_2$ is relatively small.

Figure 4E:
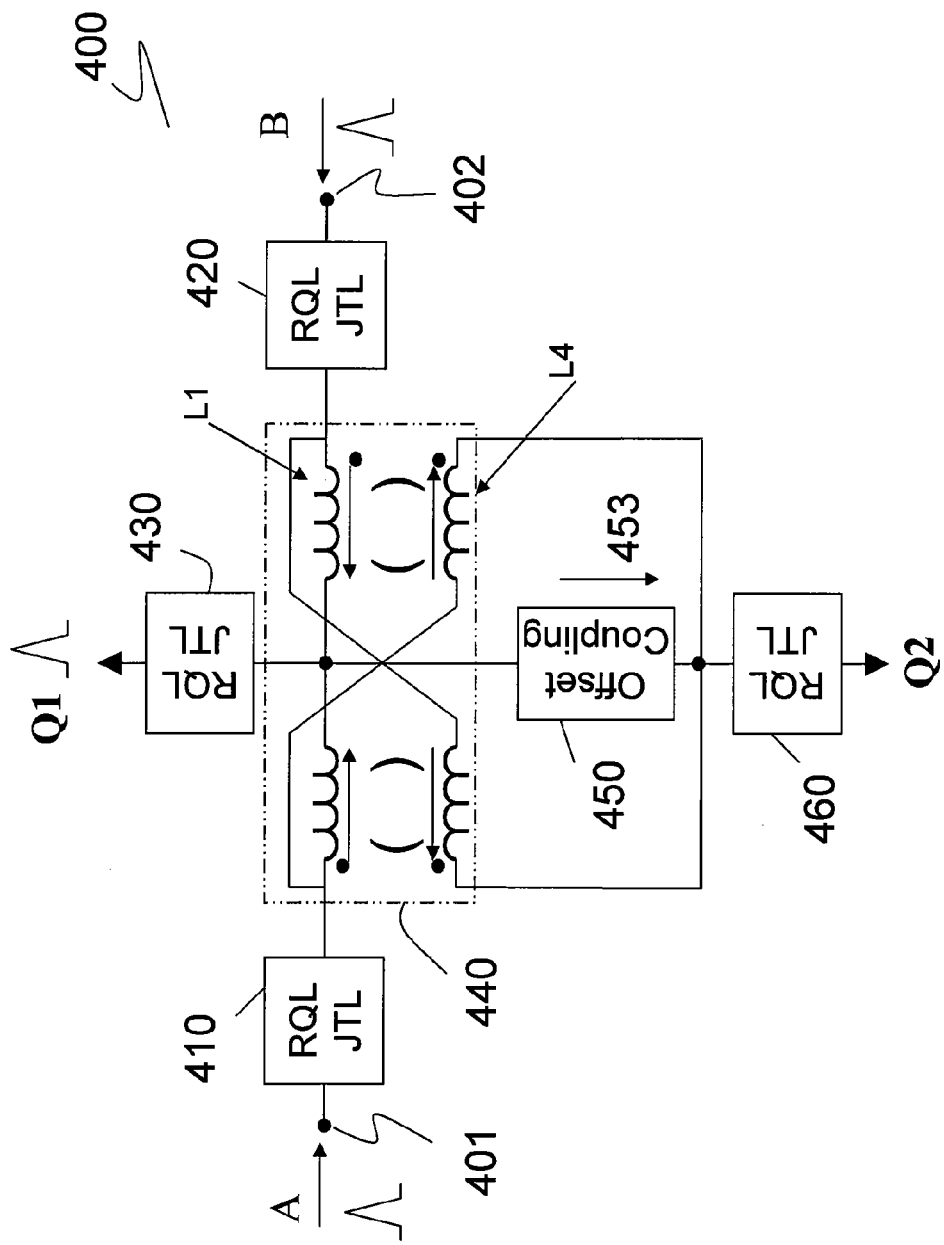
FIG. 4E shows the current flow in logic gate of FIG. 4A after first and second inputs are received and after OR output is provided.

FIG. 4E shows the current flow in logic gate of FIG. 4A after a first and second inputs and after OR output. In FIG. 4E, second input pulse B is provided after circuit 400 outputs a pulse at $Q_1$ in response to first input pulse A. The inputs steer current to both outputs $Q_1$ and $Q_2$. Offset coupling 450 steers both current to output $Q_2$ (i.e., the AND output) as shown by arrow 453.

Figure 4F:
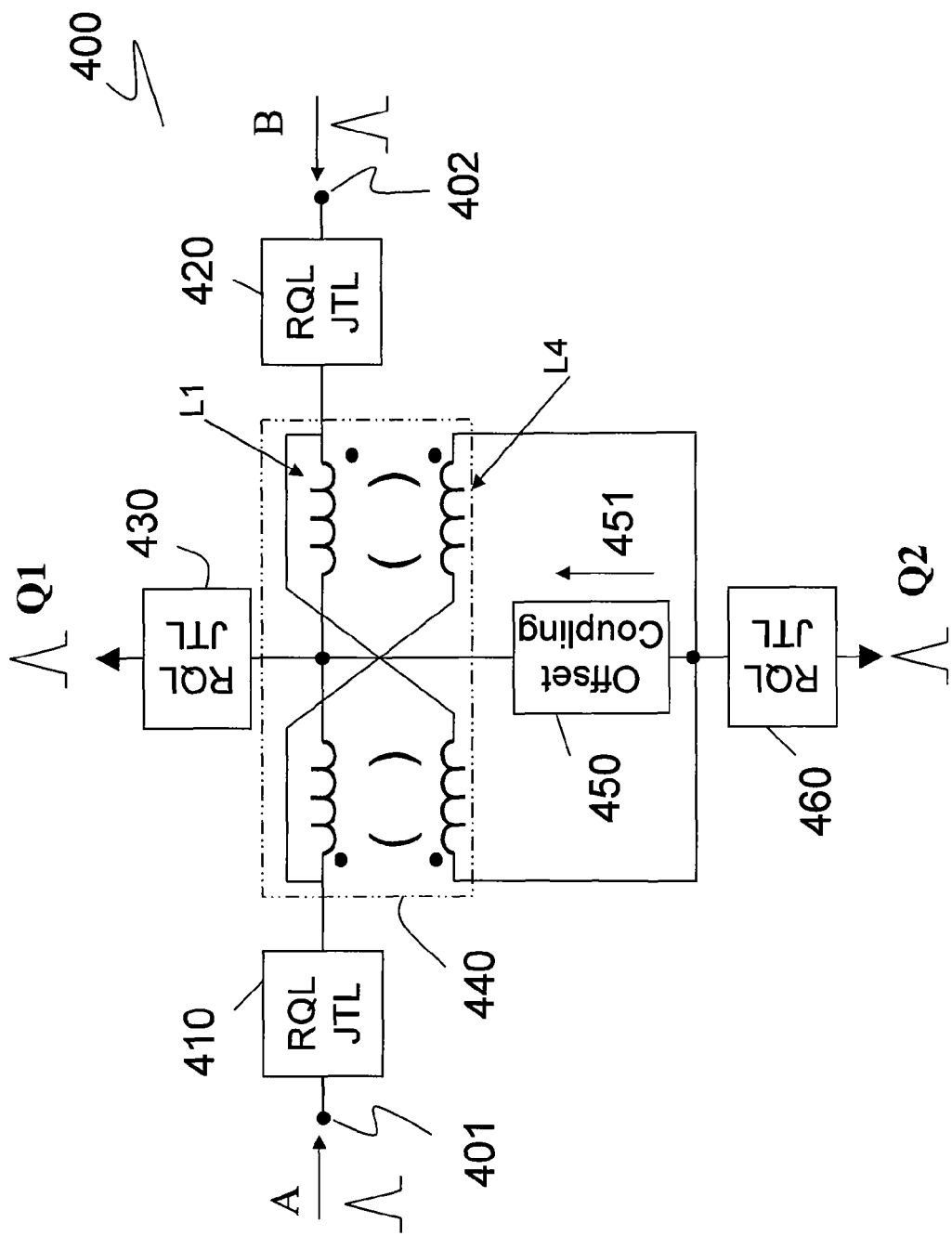
FIG. 4F shows the current flow in logic gate of FIG. 4A after first and second inputs and after outputs at both output gates.

FIG. 4F shows the current flow in logic gate of FIG. 4A after first and second input and after outputs at both output gates, all within one clock cycle. As shown, offset coupling 450 now has an offset bias 451 directed toward output gate $Q_1$, and there are no other currents set up through the inductors in the gate. Timing between inputs A and B is not critical. Thus, two simultaneous inputs will produce to outputs without violating the principles of operation of the gate. The inputs to circuit 400 are reciprocal; that is, each positive input pulse is followed by a negative input pulse which effectively resets the Josephson junctions. In other words, any residual signals stored in the gate during the positive cycle are removed in the negative cycle of the input pulse.

While the principles of the disclosure have been illustrated in relation to the exemplary embodiments shown herein, the principles of the disclosure are not limited thereto and include any modification, variation or permutation thereof.

What is claimed is:

1. A single-flux-quantum ("SFQ") logic gate comprising:
a first input gate for receiving a first input pulse;
a second input gate for receiving a second input pulse;
an output gate in parallel with the first input gate;

a first Josephson junction and a second Josephson junction connected in parallel respectively with the first input gate and the second input gate; and a cross-coupled transformer having a negative signal coefficient for diverting the first input pulse from the output gate if the second input pulse is detected;

wherein the first Josephson junction defines a first critical current and a first flux and the second Josephson junction defines a second critical current and a second flux.

2. The SFQ logic gate of claim 1, further comprising a first input filter.

3. The SFQ logic gate of claim 1, wherein the output gate is in parallel with the second input gate.

4. The SFQ logic gate of claim 1, further comprising a power supply having a DC current source and a transformer.

5. The SFQ logic gate of claim 1, wherein the cross-coupled transformer produces signal inversion against at least one of the first or the second input pulses.

6. The SFQ logic gate of claim 1, wherein the cross-coupled transformer provides a loop inductance substantially similar to the loop inductance provided by one of the input gates or output gate.

7. The SFQ logic gate of claim 1, wherein the first flux and the second flux are substantially identical.

8. The SFQ logic gate of claim 1, wherein the first critical current and the second critical current are substantially identical.

9. A method for providing a single-flux-quantum logic gate, the method comprising:
providing the single-flux-quantum logic circuit to have a first and a second input gate as well as an output gate;
receiving a first input pulse at the first input gate;
directing the single-flux-quantum logic gate to propagate the first input pulse to the output gate if a second input is not received at the second input gate; and
directing the single-flux-quantum logic gate to inhibit propagation of the first input pulse to the output gate if a second input pulse is received at the second input gate.

10. The method of claim 9, directing means providing a signal current.

11. The method of claim 9, further comprising connecting the first input gate and the second input gate through an offset coupling.

12. The method of claim 9, further comprising biasing the single-flux-quantum logic gate to inhibit propagation of the first input pulse to the output gate if a second input pulse is received at the second input gate substantially simultaneously with receiving the first input pulse at the first input gate.

13. The method of claim 9, further comprising biasing the single-flux-quantum logic gate to inhibit propagation of the first input pulse to the output gate if a second input pulse precedes the first input in time.

14. The method of claim 9, wherein the step of directing the single-flux-quantum logic gate to propagate the first input pulse further comprises providing an offset signal to enhance the propagation of the second input pulse to the output in the absence of a first input pulse.

15. The method of claim 9, wherein the step of biasing the single-flux-quantum logic gate to inhibit propagation of the first input pulse to the output gate if a second input pulse is received at the second input gate further comprises providing an offset signal for combining with the second input signal and cumulatively preventing propagation of the first input signal to the output gate.

16. The method of claim 9, wherein the first input gate comprises a first Josephson junction connected in parallel to a first input filter.

17. The method of claim 9, further comprising powering the single-flux-quantum logic circuit through a resistor and a DC current.

18. The method of claim 9, further comprising powering the single-flux-quantum logic circuit through transformer charged through an AC power source.

19. A single-flux-quantum ("SFQ") logic gate circuit, comprising:
a first input gate connected in parallel to a first Josephson junction;
a second input gate connected in parallel to a second Josephson junction;
an output gate in communication with the first and the second input gates;
an offset coupling for biasing the SFQ logic gate circuit; and
a cross-coupled transformer connecting the first Josephson junction and the second Josephson junction.

20. The SFQ logic gate of claim 19, wherein the offset coupling biases the logic gate circuit with a first flux.

21. The SFQ logic gate of claim 19, wherein the offset coupling biases the logic gate circuit with a first flux and wherein the first flux is about one half of the magnitude of the first input pulse.

22. The SFQ logic gate of claim 19, wherein the first input gate further comprises an input filter.

23. The SFQ logic gate of claim 19, wherein the cross-coupled transformer inverts a second input pulse received at the second input gate.

24. The SFQ logic gate of claim 19, wherein the cross-coupled transformer interconnects the second input gate to the first input gate in order to inhibit propagation of the first input pulse to the output gate if a second input pulse is received at the second input gate.

25. The SFQ logic gate of claim 19, wherein the offset coupling biases the single-flux-quantum logic gate to propagate the first input pulse to the output gate if a second input is not received at the second input gate.

26. A single-flux-quantum ("SFQ") logic merge gate circuit, comprising:
a first input gate for receiving a first input pulse, the first input gate coupled to a first Josephson junction;
a second input gate for receiving a second input pulse, the second input gate coupled to a second Josephson junction; and
a pair of cross-coupled transformers connecting the first Josephson junction to the second Josephson junction such that a first input received at the first input gate is prevented from propagating to the second input gate and is instead directed to an output gate.

27. The SFQ logic merge gate of claim 26, wherein the pair of cross-coupled transformers defines two loop transformers arranged to provide pulse inversion to an incoming pulse signal.

28. The SFQ logic merge gate of claim 26, wherein at least one of the first input pulse or the second input pulse defines an SFQ pulse.

29. The SFQ logic merge gate of claim 26, wherein the output is a merged signal containing the first input pulse or the second input pulse.

30. The SFQ logic merge gate of claim 26, wherein the first input pulse defines a reciprocal logical data encoding.

31. A single-flux-quantum ("SFQ") logic gate circuit, comprising:
a first input gate and a second input gate for respectively receiving a first input pulse and a second input pulse, the first input gate coupled to a first Josephson junction and the second input gate coupled to a second Josephson junction;

a pair of cross-coupled transformers connecting the first Josephson junction to the second Josephson junction;

a first output gate and a second output gate in communication with the pair of cross-coupled transformers; and an offset coupling for biasing the transformer to direct one of the first input pulse or the second input pulse to the first output gate when only one input is received during one clock cycle.

32. The SFQ logic gate of claim 31, further comprising an offset coupling for biasing the transformer to direct one of the first input pulse or the second input pulse to the first output gate when only one input pulse is received during one clock cycle.

33. The SFQ logic gate of claim 31, wherein the offset coupling biases the transformer to direct the first input pulse and the second input pulse to the second gate when the first and the second input pulses are received during one clock cycle.

34. The SFQ logic gate of claim 31, wherein the first input pulse defines a reciprocal logical data encoding.

35. The SFQ logic gate of claim 31, wherein the pair of cross-coupled transformers defines two loop transformers arranged to provide pulse inversion to an incoming pulse signal.

36. The SFQ logic gate of claim 31, wherein at least one of the first input pulse or the second input pulse defines an SFQ pulse.

37. The SFQ logic gate of claim 31, wherein the offset coupling further comprises a DC current source and a resistor for providing an inductive loop.

38. The SFQ logic gate of claim 31, wherein the offset coupling biases the logic gate circuit with a first flux and wherein the first flux is about one half of the magnitude of the first input pulse.

39. The SFQ logic gate of claim 31, further comprising a power source for supplying AC power through a transformer to the logic gate circuit.

40. The SFQ logic gate of claim 31, further comprising an AC power supply for clocking the logic gate circuit.

41. The SFQ logic gate of claim 31, wherein the first Josephson junction is selected to have a lower critical current (Ic) than the second Josephson junction.

42. The SFQ logic gate of claim 31, further comprising supplying more current to the first output gate relative to the second output gate.

43. A method for controlling an output of a logic gate, the method comprising:
    receiving a first reciprocal SFQ pulse at a first input gate and triggering a third Josephson junction in communication the a first Josephson junction;
    receiving a second reciprocal SFQ pulse at a second input gate and triggering a second Josephson junction in communication the a fourth Josephson junction;
    providing a first bias current to direct one of the first reciprocal SFQ pulse or the second reciprocal SFQ pulse to a first output if only one of the first reciprocal SFQ pulse or the second reciprocal SFQ pulse is received during one clock cycle; and
    directing the second reciprocal SFQ pulse to a second output if both the first and the second input signals are received during one clock cycle.

44. The method of claim 43, further comprising providing first bias current defines a flux of about one half of the first reciprocal SFQ pulse.

45. The method of claim 43, further comprising providing first bias current defines a flux of about one half of the second reciprocal SFQ pulse.

46. The method of claim 43, wherein the step of directing the first reciprocal SFQ pulse and the second reciprocal SFQ pulse to a second output further comprises configuring the first Josephson junction to have a lower critical current ($I_c$) than the second Josephson junction.

47. The method of claim 43, wherein the step of directing the first reciprocal SFQ pulse and the second reciprocal SFQ pulse to a second output further comprises supplying more power to the first output gate relative to the second output gate.

48. The method of claim 43, wherein the step of directing the first reciprocal SFQ pulse and the second reciprocal SFQ pulse to a second output further comprises using an offset coupling to direct the first and the second pulses to the first output gate.

* * * * *